US010247996B2

(12) United States Patent
Driscoll et al.

(10) Patent No.: US 10,247,996 B2
(45) Date of Patent: Apr. 2, 2019

(54) THERMAL CONTROL OF VARIABLE TRANSMITTANCE WINDOWS

(71) Applicant: Gentex Corporation, Zeeland, MI (US)

(72) Inventors: David I. Driscoll, Caledonia, MI (US); Bradley L. Busscher, Grand Rapids, MI (US); Michael T. Stephenson, Holland, MI (US); Kevin L. Ash, Grand Rapids, MI (US); William L. Tonar, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 8 days.

(21) Appl. No.: 15/630,100

(22) Filed: Jun. 22, 2017

(65) Prior Publication Data
US 2017/0371222 A1    Dec. 28, 2017

Related U.S. Application Data

(60) Provisional application No. 62/353,390, filed on Jun. 22, 2016.

(51) Int. Cl.
*B60J 3/04* (2006.01)
*G02F 1/153* (2006.01)
(Continued)

(52) U.S. Cl.
CPC ............ *G02F 1/163* (2013.01); *B60J 3/04* (2013.01); *B60R 16/023* (2013.01); *E06B 9/24* (2013.01); *G02F 1/153* (2013.01); *B61D 25/00* (2013.01); *E06B 3/6722* (2013.01); *E06B 2009/247* (2013.01); *E06B 2009/2417* (2013.01);
(Continued)

(58) Field of Classification Search
CPC .. B60J 3/04; G02F 1/153; G02F 1/155; G02F 1/157; G02F 1/163; G02F 2203/48; G02F 1/01; B60R 1/088; B60R 16/023; B61D 25/00; G01R 1/40; G01R 1/42; G01R 1/44; G01R 19/00; G01R 21/006; G01R 21/02; G01R 21/06; G01R 31/002; E06B 9/24; E06B 2009/2464; E06B 2009/247;
(Continued)

(56) References Cited

U.S. PATENT DOCUMENTS 5,202,787 A    4/1993  Byker et al.
5,247,244 A    9/1993  Miller et al.
(Continued)

FOREIGN PATENT DOCUMENTS

JP            S59220413 A    12/1984

OTHER PUBLICATIONS

International Search Report and Written of the International Searching Authority, dated Sep. 21, 2017, for International Application No. PCT/US2017/038788 filed Jun. 22, 2017; 9 pages.

*Primary Examiner* — Loha Ben
(74) *Attorney, Agent, or Firm* — Price Heneveld LLP; Bradley D. Johnson (57) ABSTRACT

An electrical control system for controlling a variable transmittance window is disclosed. The system comprises a driver circuit in communication with an electro-optic element. A controller is in communication with the driver circuit. The controller is configured to identify a temperature condition of the electro-optic element and adjust an output voltage supplied to the electro-optic element in response to the temperature condition.

19 Claims, 6 Drawing Sheets

(51) Int. Cl.
*G02F 1/163* (2006.01)
*E06B 9/24* (2006.01)
*E06B 3/64* (2006.01)
*B60R 16/023* (2006.01)
*G02F 1/01* (2006.01)
G09G 3/34 (2006.01)
G09G 3/38 (2006.01)
G01R 31/00 (2006.01)
G01R 21/02 (2006.01)
G01R 21/06 (2006.01)
B61D 25/00 (2006.01)
E06B 3/67 (2006.01)

(52) U.S. Cl.
CPC ...... *E06B 2009/2464* (2013.01); *G01R 21/02* (2013.01); *G01R 21/06* (2013.01); *G01R 31/002* (2013.01); *G02F 2203/48* (2013.01); *Y02T 30/40* (2013.01)

(58) Field of Classification Search
CPC . E06B 2009/2417; E06B 3/6722; G09G 3/34; G09G 3/38
USPC ........ 359/237–239, 245, 249, 265, 275–279, 359/288, 289; 324/96, 98, 105; 250/201.1, 203.4; 700/19, 20, 22, 23, 25; 345/105, 106
See application file for complete search history.

(56) References Cited

U.S. PATENT DOCUMENTS

| | | |
|---|---|---|
| 5,805,330 A | 9/1998 | Byker et al. |
| 5,940,201 A | 8/1999 | Ash et al. |
| 6,137,620 A | 10/2000 | Guarr et al. |
| 6,239,898 B1 | 5/2001 | Byker et al. |
| 6,407,847 B1 | 6/2002 | Poll et al. |
| 6,433,914 B1 | 8/2002 | Lomprey et al. |
| 6,567,708 B1 | 5/2003 | Bechtel et al. |
| 6,597,489 B1 | 7/2003 | Guarr et al. |
| 7,085,609 B2 | 8/2006 | Bechtel et al. |
| 7,372,611 B2 | 5/2008 | Tonar et al. |
| 7,864,398 B2 | 1/2011 | Dozeman et al. |
| 8,102,586 B2 | 1/2012 | Albahri |
| 8,218,223 B2* | 7/2012 | Matthews ............... G02F 1/163 359/265 |
| 8,947,759 B2* | 2/2015 | Greer .................... G02F 1/1523 359/275 |
| 9,628,192 B2* | 4/2017 | Liao ......................... H01S 5/00 |

* cited by examiner

FIG. 6

THERMAL CONTROL OF VARIABLE TRANSMITTANCE WINDOWS

CROSS-REFERENCE TO RELATED APPLICATION

This application claims priority to and the benefit under 35 U.S.C. § 119(e) of U.S. Provisional Patent Application No. 62/353,390, filed on Jun. 22, 2016, entitled "THERMAL CONTROL OF VARIABLE TRANSMITTANCE WINDOWS," the entire disclosure of which is hereby incorporated herein by reference.

FIELD OF TECHNOLOGY

The present invention generally relates to variable transmission windows. More specifically, the present invention relates to control systems for controlling the transmission of variable transmission windows.

BACKGROUND OF THE INVENTION

Variable transmission windows may be applied commercially in vehicles designed for the transportation of passengers, such as, for example, busses, airplanes, trains, ships, and automobiles. Providing for the use of variable transmission windows in these types of vehicles creates various challenges. The disclosure may provide various systems and methods configured to resolve one or more issues related to the application of variable transmission windows. Though exemplary embodiments of one or more systems or apparatuses are discussed in detail, the embodiments may be to combined or customized to suit various applications.

SUMMARY OF THE INVENTION

According to one aspect of the present invention, a variable transmittance window system is disclosed. The system comprises an electro-optic element disposed in a window assembly and a driver circuit in communication with the electro-optic element. A current sensor is configured to identify a current draw of the driver circuit. A controller is in communication with the driver circuit and the current sensor. The controller is configured to identify a temperature of the electro-optic element based on the current draw and compare the temperature to a temperature threshold. In response to the temperature exceeding the temperature threshold, the controller is configured to increase a transmittance of the electro-optic element.

According to another aspect of the present invention, an electrical control system for controlling a variable transmittance window is disclosed. The system comprises a driver circuit in communication with an electro-optic element. A controller is in communication with the driver circuit. The controller is configured to identify a temperature condition of the electro-optic element and adjust an output voltage supplied to the electro-optic element in response to the temperature condition.

According to yet another aspect of the present invention, a variable transmittance window system is disclosed. The system comprises an electro-optic element disposed in a window assembly and a driver circuit in communication with the electro-optic element. At least one sensor is configured to identify a property of the electro-optic element. A controller is in communication with the driver circuit and the at least one sensor. The controller is configured to identify a temperature based on the property of the electro-optic element, compare the temperature to a temperature threshold, and increase a transmittance of the electro-optic element in response to the temperature exceeding the temperature threshold.

The above aspects may be implemented separately or in various combinations. Although described as different aspects or in different embodiments, the characteristics thereof are not necessarily mutually exclusive of one another and thus may be used together.

These and other features, advantages and objects of the present invention will be further understood and appreciated by those skilled in the art by reference to the following specification, claims and appended drawings.

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numerals will be used throughout the drawings to refer to the same or like parts.

For purposes of description herein, the terms "upper," "lower," "right," "left," "rear," "front," "vertical," "horizontal," "top," "bottom," and derivatives thereof shall relate to the invention as shown in the drawings. However, it is to be understood that the invention may assume various alternative orientations, except where expressly specified to the contrary. It is also to be understood that the specific device illustrated in the attached drawings and described in the following specification is simply an exemplary embodiment of the inventive concepts defined in the appended claims. Hence, specific dimensions, proportions, and other physical characteristics relating to the embodiment disclosed herein are not to be considered as limiting, unless the claims expressly state otherwise.

Figure 1:
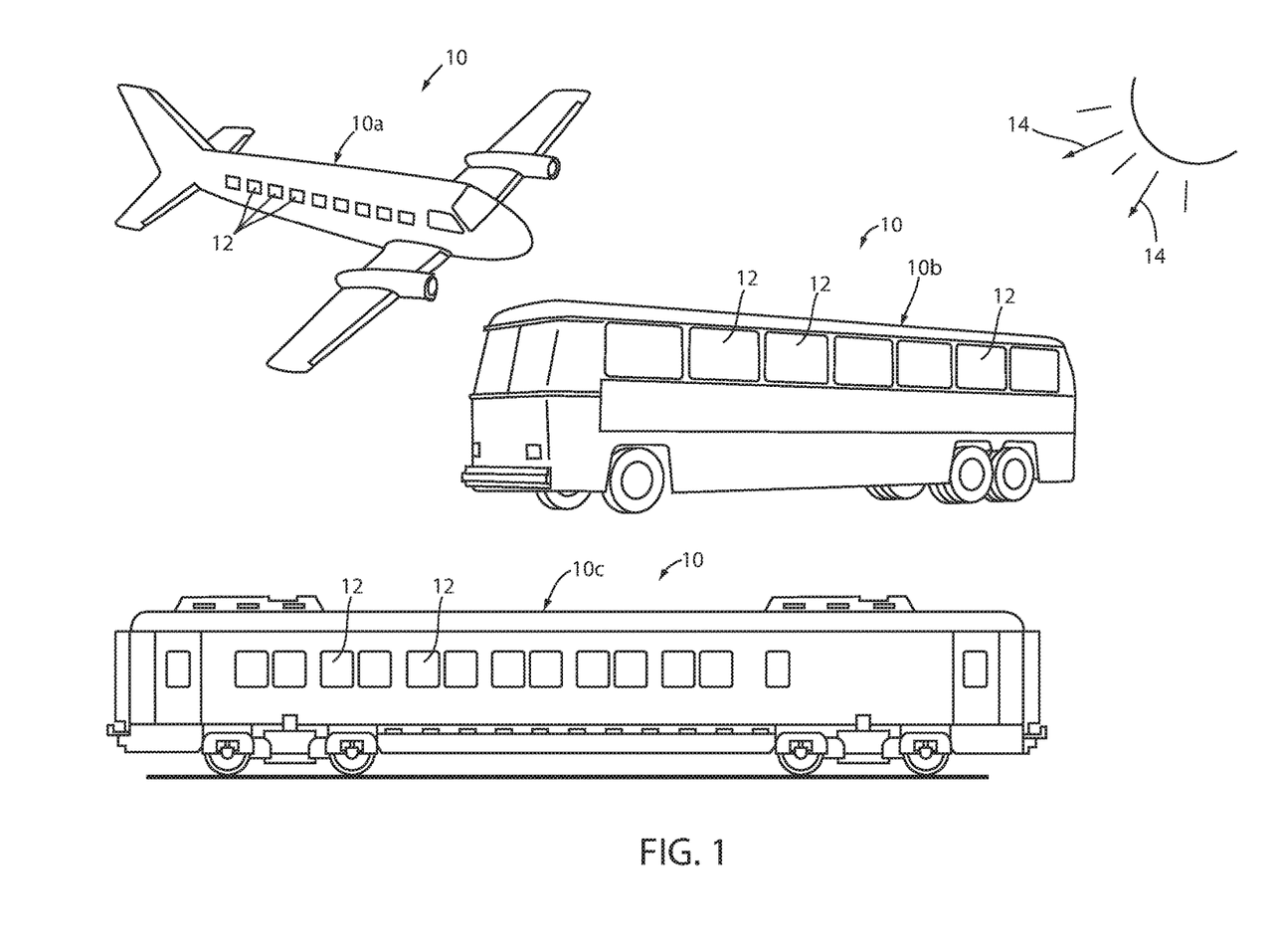
FIG. 1 is a general illustration of multi-passenger vehicles incorporating variable transmission windows.

The disclosure provides for various systems and methods for controlling thermal energy that may accumulate in a variable transmission window assembly during operation. Referring to FIG. 1, a graphical representation of a variety of exemplary, multi-passenger vehicles 10 is shown. Such vehicles 10 and various other forms of vehicles (e.g. automobiles) may employ one or more variable transmittance windows 12. Such vehicles may include, but are not limited to, aircraft 10*a*, buses 10*b*, trains 10*c*, and a variety of passenger vehicles. It should be appreciated that other vehicles may employ variable transmittance windows 12.

The multi-passenger vehicles generally illustrated in FIG. 1 may also include window control systems (not shown) for controlling variable transmittance windows 12. Such control systems may be configured to vary the transmittance of the windows 12 while ensuring that the variable transmittance windows 12 are operating in a desired temperature range.

As discussed herein, the variable transmittance windows 12 may correspond to windows that are operable to change in transmissivity based on electrical signals applied to an electro-optic element 22. Examples of variable transmission windows are generally described in commonly assigned U.S. Pat. No. 6,407,847 entitled "ELECTROCHROMIC MEDIUM HAVING A COLOR STABILITY", U.S. Pat. No. 6,239,898 entitled "ELECTROCHROMIC STRUCTURES," U.S. Pat. No. 6,597,489 entitled "ELECTRODE DESIGN FOR ELECTROCHROMIC DEVICES," and U.S. Pat. No. 5,805,330 entitled "ELECTRO-OPTIC WINDOW INCORPORATING A DISCRETE PHOTOVOLTAIC DEVICE," the entire disclosures of each of which are incorporated herein by reference. Examples of electrochromic devices that may be used in windows are described in U.S. Pat. No. 6,433,914 entitled "COLOR-STABILIZED ELECTROCHROMIC DEVICES," U.S. Pat. No. 6,137,620 entitled "ELECTROCHROMIC MEDIA WITH CONCENTRATION-ENHANCED STABILITY, PROCESS FOR THE PREPARATION THEREOF AND USE IN ELECTROCHROMIC DEVICES," U.S. Pat. No. 5,940,201 entitled "ELECTROCHROMIC MIRROR WITH TWO THIN GLASS ELEMENTS AND A GELLED ELECTROCHROMIC MEDIUM," and U.S. Pat. No. 7,372,611 entitled "VEHICULAR REARVIEW MIRROR ELEMENTS AND ASSEMBLIES INCORPORATING THESE ELEMENTS," the entire disclosures of each of which are incorporated herein by reference. Other examples of variable transmission windows and systems for controlling them are disclosed in commonly assigned U.S. Pat. No. 7,085,609, entitled "VARIABLE TRANSMISSION WINDOW CONSTRUCTIONS," and U.S. Pat. No. 6,567,708 entitled "SYSTEM TO INTERCONNECT, LINK, AND CONTROL VARIABLE TRANSMISSION WINDOWS AND VARIABLE TRANSMISSION WINDOW CONSTRUCTIONS," the entire disclosures of each of which are incorporated herein by reference.

Figure 2:
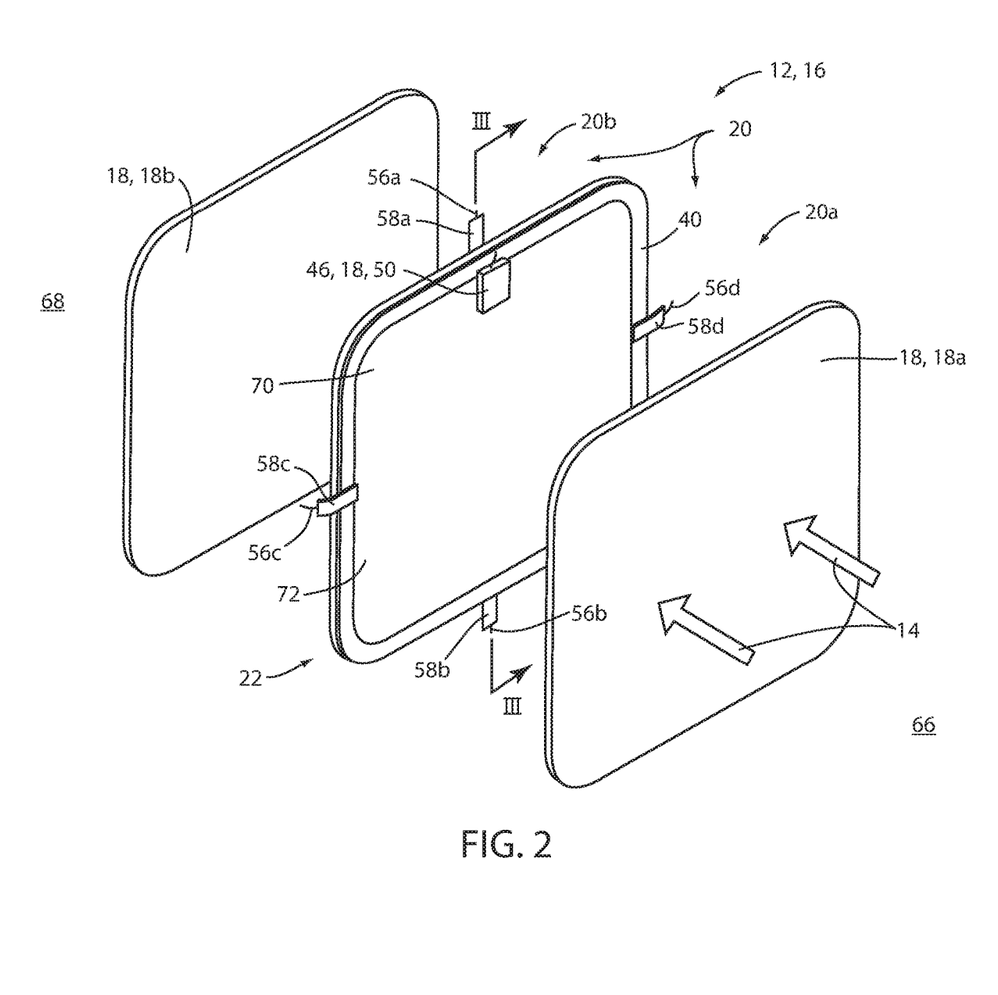
FIG. 2 is a perspective view illustrating a variable transmission window assembly comprising a plurality of protective panels.
Figure 3:
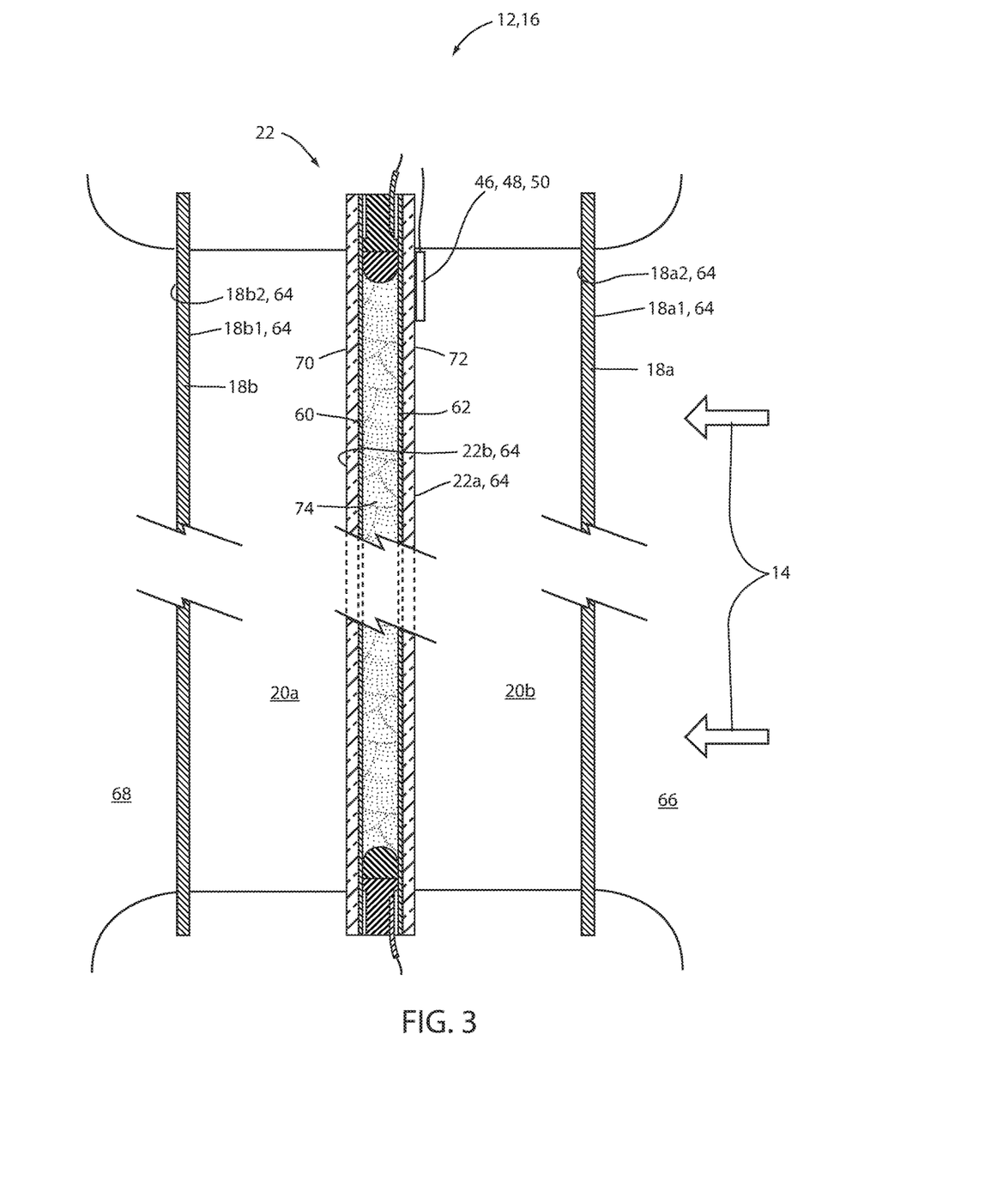
FIG. 3 is a partial cross-sectional view taken through line III-III of the variable transmission window and supporting structure illustrated in FIG. 2.

Referring now to FIGS. 1-3, an exemplary embodiment of the variable transmittance window 12 is demonstrated as a multi-pane window assembly 16. For example, in a dimmed or limited transmission state, the variable transmittance window 12 may be significantly dark, such that incident radiation 14 is converted into thermal energy. The thermal energy may be dissipated in the window assembly 16, which may comprise a plurality of window panes 18. In some embodiments, the dissipation of the thermal energy in the window assembly 16 may be significantly limited to thermal convection due to construction constraints of the window assembly 16 and the adjacent support frame.

As a result of the thermal convection, the temperatures of one or more air gaps 20 formed between the panes 18 and the electro-optic element 22 may be elevated. In some environments, the temperatures of the panes 18 and the electro-optic element 22 may increase to the extent that they become unpleasant to the touch. In order to control the temperature of the window assembly 16, the disclosure provides for one or more control circuits configured to monitor, predict, or otherwise identify the temperature or associated conditions of the window assembly 16 that may result in elevated temperatures. In this way, the disclosure may provide for various solutions configured to control an operating temperature of the window assembly 16.

Figure 4:
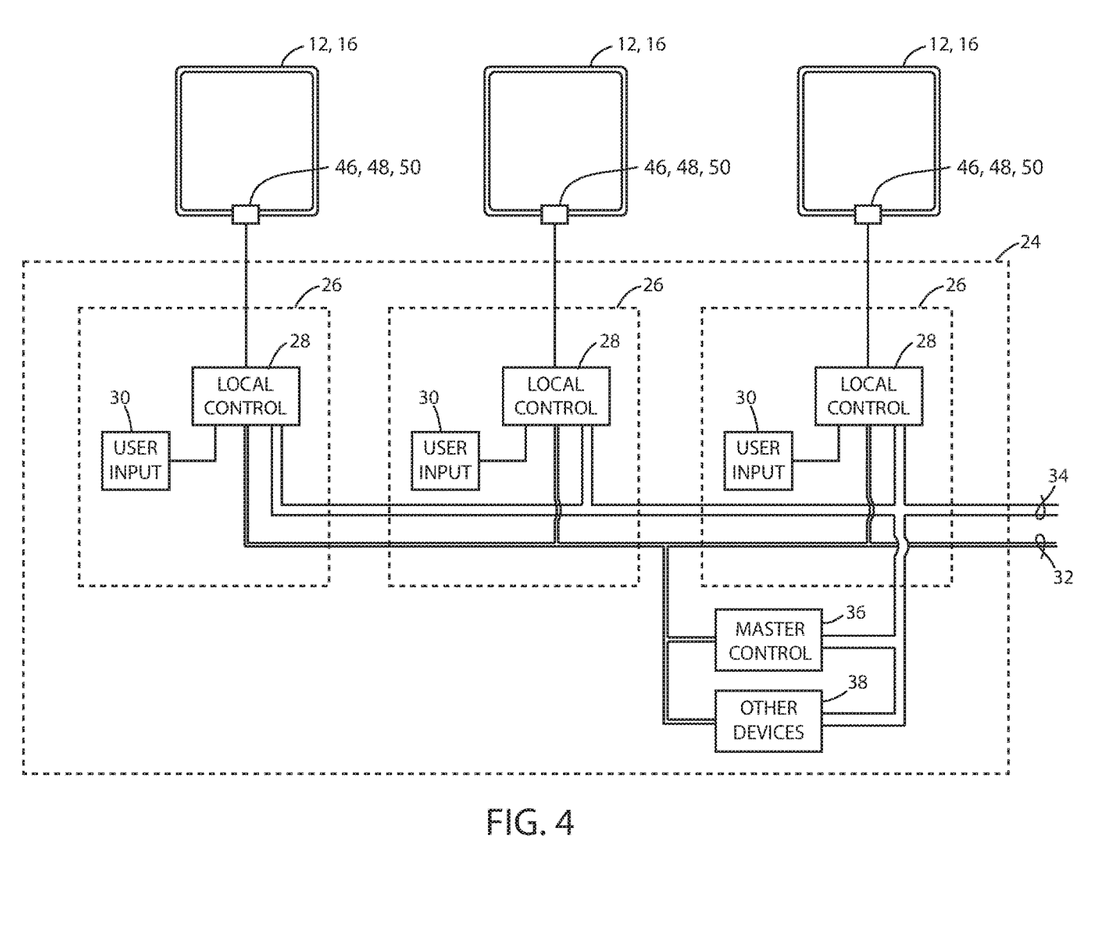
FIG. 4 is a block diagram generally illustrating a system for controlling variable transmission windows.
Figure 5:
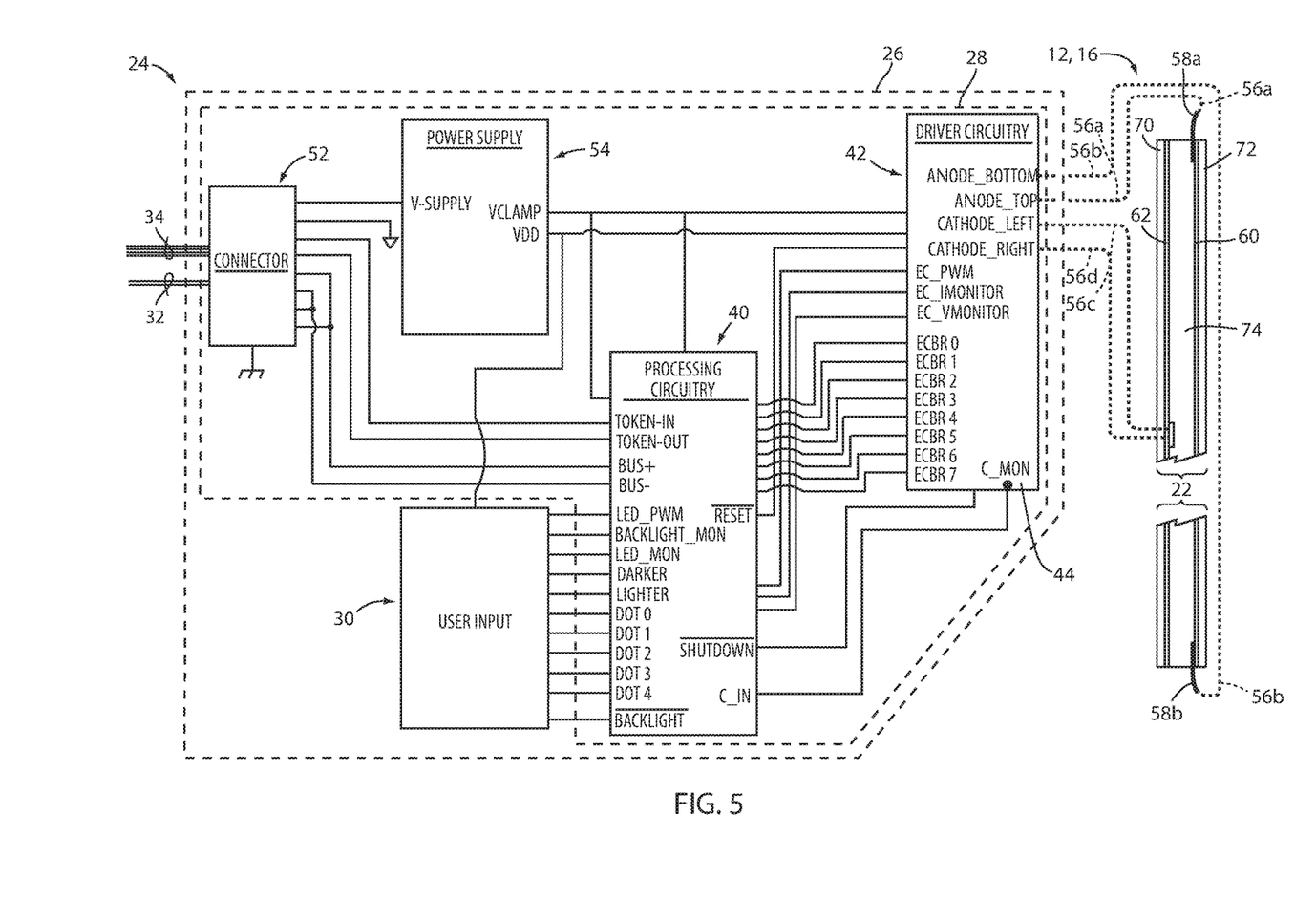
FIG. 5 is a block diagram generally illustrating a local controller and user input mechanism for controlling a variable transmission window.

For example, referring now to FIGS. 4 and 5, in some embodiments, a window control system 24 may be utilized to identify a temperature or associated condition that may lead to an elevated temperature of the window assembly 16 above a predetermined temperature threshold. The window control system 24 may be configured to monitor one or more sensors or operating conditions of the window assembly 16 to identify elevated temperature conditions. The elevated temperature conditions may be monitored directly via a temperature sensor 48 and/or may be determined/inferred from an operating condition of the electro-optic element 22. Some examples of operating conditions of the electro-optic element 22 that may be monitored by the window control system 24 may include, but are not limited to, an operating energy (current draw) or a transmission state of the electro-optic element 22. Accordingly, the window control system may be configured to identify a temperature or associated condition of the window assembly 16 that may lead to elevated temperatures.

In response to the elevated temperatures or associated conditions, the window control system 24 may control the transmittance of the electro-optic element 22 to lighten or increase in transmittance. In this way, the window control system 24 may control the conversion of the incident radiation 14 to thermal energy in the window assembly 16 thereby limiting the temperature of the widow assembly 16. For example, in a highly darkened transmission state, the electro-optic element 22 may have a high efficiency or rate of conversion of the incident radiation 14 to thermal energy. Based on the elevated temperatures or associated conditions of the window assembly 16, the control system 24 may increase a transmittance of the electro-optic element 22 (e.g. lighten) to limit the conversion of the incident radiation 14. In this way, the control system 24 may control the temperature of the window assembly 16.

Referring now to FIGS. 4 and 5, an overview of the system 24 configured to control one of more variable transmittance windows 12 is generally discussed. The system 24 may comprise various features and controls that may be utilized to control the temperature of a variable transmittance window 12. Additionally, the system 24 may provide for an exemplary application of variable transmittance windows 12 in a multi-passenger vehicle. Accordingly, the disclosure may comprise one or more elements of the system 24 to suit a particular application and various controls or components of the system 24 may be utilized or omitted without departing from the spirit of the disclosure.

Referring now to FIG. 4, the system 24 comprising a plurality of variable transmittance windows 12 is shown. The windows 12 may be employed in multi-passenger vehicles 10. Additionally, the window control system 24 may be electrically coupled to the variable transmittance windows 12 for controlling the transmittance state of the windows 12. The window control system 24 may include a window control unit 26 coupled to one or more of the variable transmittance windows 12. The window control unit 26 may be configured to control the transmittance of each of the variable transmittance windows 12.

In some embodiments, the window control unit 26 may comprise local control circuitry 28 for controlling the transmittance state of an associated variable transmittance window 12. The window control unit 26 may also be in communication with a user input mechanism 30 coupled to the local control circuitry 28. The user input mechanism 30 may be configured to receive a user input to the local control circuitry 28. In this configuration a passenger may change the transmittance state of the associated variable transmittance window 12 via the user input mechanism 30.

The window control unit 26 is also shown coupled to power and ground lines 32 for providing power to the local control circuitry 28, the user input mechanism 30, and the variable transmittance window 12. As shown, power is provided to variable transmittance window 12 via local control circuitry 28 from the power and ground lines 32. Each window control unit 26 may also be coupled to a window control system bus 34. Other devices also coupled to the window control system bus 34 may include master control circuitry 36 and other electronic devices 38.

The master control circuitry 36 may be configured to monitor signals provided on the window control system bus 34 by each of window control units 26 and to provide control signals on the bus to each of window control units 26. The master control circuitry 36 may include processing circuitry, including logic, memory, and bus interface circuitry, to permit the master control circuitry 36 to generate, send, receive, and/or decode signals on the window control system bus 34. Local control circuitry 28 may also be included in each of the window control units 26 and may be configured to receive a desired window transmittance state from user input mechanism 30. Based on the user input, the window control units 26 may provide electrical signals to the variable transmittance windows 12 to change the transmittance state of variable transmittance window 12 to the state requested by the user via user input mechanism 30.

The master control circuitry 36 may be configured to issue override signals to window control units 26 via the window control system bus 34. These override signals may have the effect of directing the local control circuitry 28 of each of the window control units 26 to change the transmittance state of variable transmittance windows 12 to the state selected by the override signal sent by master control circuitry 36. Override signals issued on the window control system bus 34 by the master control circuitry 36 may include signals to cause all variable transmittance windows to darken, lighten, go to the darkest state, go to the lightest state, or go to a predetermined intermediate transmittance state.

Referring still to FIGS. 4 and 5, an exemplary embodiment of a control scheme for the window control unit 26 is now described. Though discussed in relation to a particular control scheme, the disclosure provides for various methods to control the temperature of a variable transmittance window and various corresponding assemblies. Accordingly, various elements of the systems and methods discussed herein may be combined or customized to suit a particular application.

In some embodiments, the master control circuitry 36 and/or the local control circuitry 28 may be configured to control a temperature of the one or more of the variable transmittance windows 12. For example, in an exemplary embodiment, the local control circuitry 28 may be configured to identify a condition of one or more of the variable transmittance windows 12 that may correspond to an increased temperature condition. For example, the local control circuitry 28 may comprise processing circuitry 40 and/or driver circuitry 42 configured to monitor a current supplied to the electro-optic element 22. For example, in an exemplary embodiment, the driver circuitry 42 may comprise a current monitor 44 configured to communicate the current drawn by the electro-optic element 22 to the processing circuitry 40.

Based on a current signal received from the current monitor 44, the processing circuitry 40 may limit a darkness or define a minimum transmittance and associated voltage for the driver circuitry 42. For example, in response to the current signal and corresponding current supplied to the electro-optic element 22, the processing circuitry 40 may control the driver circuitry 42 to maintain a minimum or increased transmittance of the electro-optic element 22. The increased transmittance may be greater than instructed by the user input mechanism 30 or the master control circuitry 36. In this way, the control circuitry 40 may set a minimum transmittance to control one or more of the electro-optic elements 22 of the variable transmittance windows 12 to prevent excess temperature buildup that may otherwise result due to a darkened state of the electro-optic element 22.

In some embodiments, the processing circuitry 40 may additionally or alternatively be in communication with one or more sensors 46. For example, the one or more sensors 46 may comprise a temperature sensor 48, a photo sensor 50, or other sensors that may be utilized to identify a light transmittance, brightness, and/or temperature of an electro-optic element 22 or the associated assembly 16. The one or more sensors 46 may communicate temperature information or information from which the temperature of the window assembly 16 may be inferred or determined. In response to signals from the one or more sensors 46, the processing circuitry 40 may be configured to identify a temperature and/or control the driver circuitry 42 to maintain a minimum or increased transmittance of the electro-optic element 22. In this way, the system 24 may provide for thermal control of the variable transmittance windows 12.

In some embodiments, the system 24 may be configured to control the temperature of a plurality of the variable transmittance windows 12 independently. For example, depending on a specific configuration of the system 24, one or more variable transmittance windows 12 may be configured to be controlled by associated local control circuitry 28. In this configuration, processing circuitry 40 of the local control circuitry 28 may independently monitor and conditions associated with and control the temperature of the variable transmittance windows 12 independently. As discussed herein, such conditions may correspond to a current draw of the electro-optic element 22, a temperature of a variable transmittance window 12, and/or a brightness or light transmittance of the variable transmittance windows 12. In this way, the system 24 may provide for independent temperature control of one or more of the variable transmittance windows 12.

In some embodiments, the master control circuitry 36 may be configured to control the temperature of a plurality of the variable transmittance windows 12. For example, the master control circuitry 36 may be in communication with one or more of the current monitors 44 and/or the one or more sensors 46. In this configuration, the master control circuitry 36 may receive the current signal and/or sensor signals from the current monitors 44 and/or the one or more sensors 46 via the window control system bus 34. Accordingly, the master control circuitry 36 may be configured to set a minimum transmittance or increase a transmittance of the plurality of the variable transmittance windows 12, which may include all of the variable transmittance windows 12 of the system 24. In this configuration, the disclosure may provide for a central control scheme for the system 24 to control the temperature of a plurality of the variable transmittance windows 12.

As discussed herein, the processing circuitry 40 may be configured to send control signals indicative of a selected transmittance state of a variable transmittance window 12 to the driver circuitry 42. Processing circuitry 40 may also be configured to receive status information from driver circuitry 42. Status information may include, but is not limited to, the transmittance state of the variable transmittance window 12, power being supplied to variable transmittance window 12 by driver circuitry 42, and status and error condition information associated with driver circuitry 42 and/or variable transmittance window 12. Although the processing circuitry 40 of the present embodiment includes a microcontroller, it should be appreciated that in alternate embodiments, processing circuitry 40 may be implemented using discrete digital or analog components or a combination of discrete analog and digital components.

Although variable transmittance windows 12 and local control circuitry 28 are shown each having their own user input mechanism 30, it should be appreciated that the input mechanism 30 may provide an input to control the transmittance of multiple variable transmittance windows 12. In some embodiments, a transmittance state selected by the user via user input mechanism 30 may be transmitted to other window control units 26 by the window control system bus 34. Additionally, the user input mechanism 30 may be directly coupled to local control circuitry 28 in multiple window control units 26 for controlling the transmittance of the variable transmittance windows 12 coupled to the local control circuitry 28 of those window control units 26. Accordingly, the various control circuits discussed herein may be configured to suit a variety of applications without departing from the spirit of the disclosure.

The window control unit 26 may include the local control circuitry 28 coupled to user input mechanism 30. The local control circuitry 28 may provide power and indicator signals to the user input mechanism 30. Additionally, the local control circuitry 28 may receive user inputs from the user input mechanism 30. The local control circuitry 28 may include a connector 52 coupled to a supply voltage and window control system bus 34 of a window control system. The connector 52 may be electrically coupled to the power supply circuitry 54 and provide a supply voltage from the window control system to power supply circuitry 54.

The power supply circuitry 54 may include filtering circuitry, protection circuitry, and conversion circuitry. The power supply circuitry 54 may be configured to provide multiple voltages to additional circuitry in window control unit 26. The local control circuitry 28 also may include processing circuitry 40. Processing circuitry 40 receives a VCLAMP voltage and VDD voltage from power supply circuitry 54. Processing circuitry 40 may be electrically coupled to the window control system bus 34 via connector 52, and may be configured to send and receive identification and control signals by the token and bus lines of the window control system bus 34.

The driver circuitry 42 of local control circuitry 28 may be electrically coupled to power supply circuitry 54, processing circuitry 40, and at least one variable transmittance window 12. The driver circuitry 42 may receive a VCLAMP voltage and a VDD voltage from power supply circuitry 54. The driver circuitry 42 may be configured to receive control signal information, including, but not limited to, a desired transmittance state for variable transmittance window 12 from processing circuitry 40. The driver circuitry 42 may provide an electrochromic supply 56a, also referred to as ANODE_TOP, and an electrochromic supply 56b, also referred to as ANODE_BOTTOM, to conducting structures 58a and 58b, respectively.

In operation, the driver circuitry 42 may vary the current and/or voltage supplied by electrochromic supplies 56a, 56b, 56c, and 56d to vary the electronic potential of conducting structures 58a, 58b, 58c, and 58d, and conductive layers 60 and 62 In this way, the driver circuitry 42 may achieve a desired transmittance through electro-optic element 22 based on a transmittance signal provided to driver circuitry 42 by processing circuitry 40.

As discussed herein, the processing circuitry 40 may be configured to respond to inputs or signals in accordance with a hierarchical control scheme. For example, the processing circuitry 40 may be configured to prioritize control of the variable transmittance window 12 first in response to a control signal from the master control circuitry 36. For example, the processing circuitry 40 may follow an instruction received from the master control circuitry 36 instead of the user input mechanism 30. Further, the processing circuitry 40 may limit a control request or signal from either the master control circuitry 36 or the user input mechanism 30 to control the temperature of the variable transmittance window 12. Although the processing circuitry 40 generally determines the transmittance state of variable transmittance window 12, it should be appreciated that, in some embodiments, additional circuitry may also affect the transmittance state of the variable transmittance windows 12.

FIG. 2 Illustrates a perspective view of the window assembly 16 comprising a plurality of protective panels or window panes 18. FIG. 3 is a partial cross-sectional view of the window assembly 16 taken through line III-III illustrated in FIG. 2. Referring to FIGS. 2 and 3, in some embodiments, the system 24 may be configured to control the window assembly 16 comprising at least one protective pane 18 and provide for thermal control of the window assembly 16. As previously discussed herein, the thermal energy received in the window assembly 16 may increase in response to a transmission state or level of light transmittance of the electro-optic element 22. For example, the temperature of the electro-optic element 22, the window panes 18, and the one or more air gaps 20 formed therebetween may increase in response to a darkness and corresponding lack of transmittance of the window assembly 16. Accordingly, the system 24 may be configured to increase or adjust the transmittance of the window assembly 16 to control the temperature of the window assembly 16.

In some embodiments, the window control system 24 may be utilized to identify a temperature or associated condition that may lead to an elevated temperature of the window assembly 16 above a predetermined temperature threshold. In various embodiments, the system 24 may be configured to monitor the one or more sensors 46 and/or the current monitor 44 to identify elevated temperature conditions of the window assembly 16. As demonstrated in FIG. 4, the temperature sensor 48 and/or the photo sensor 50 may be in communication with the processing circuitry to limit the darkness of the electro-optic element 22 to control the associated temperature of the electro-optic element 22, the window panes 18, and the one or more air gaps 20 formed therebetween.

As shown, in FIGS. 2 and 3, the window assembly 16 may comprise the at least one sensor 46 in connection with the electro-optic element 22 and in a first air gap 20a between a first window pane 18a and the electro-optic element 22. In some embodiments, the at least one sensor 46 may be disposed in a second air gap 20b between a second window pane 18b and the electro-optic element 22. The at least one sensor 46 may be configured to communicate sensor data to the processing circuitry 40. The sensor data may correspond to temperature data or signals from the temperature sensor 48 and/or light data from the photo sensor 50.

Also demonstrated in FIGS. 2 and 3, the electrochromic supply lines 56a, 56b, 56c, and 56d from the local control circuitry 28 are shown coupled to conducting structures 58a, 58b, 58c, and 58d, respectively, of variable transmittance window 12. In operation, the driver circuitry 42 may vary the current and/or voltage supplied by electrochromic supplies 56a, 56b, 56c, and 56d to vary the electronic potential of conducting structures 58 and the conductive layers 60 and 62. In this way, the driver circuitry 42 may achieve a desired transmittance through electro-optic element 22 based on a transmittance signal provided to driver circuitry 42 by processing circuitry 40.

Each of the first window pane 18a, the second window pane 18b, and the electrochromic element 22 comprise surfaces 64 that may increase in temperature due to the conversion of the incident radiation 14 to thermal energy. The first window pane 18a and the second window pane 18b may comprise a first pane surface 18a1, a second pane surface 18a2, a third pane surface 18b1, and a fourth pane surface 18b2. Additionally, the electro-optic element 22 may comprise a first element surface 22a and a second element surface 22b. During test operation, temperatures of the surfaces 64 of a window assembly similar to the window assembly 16 were measured as follows in response to a temperature of 49° C. corresponding to an exterior region 66 and a temperature of 25° C. corresponding to an interior region 68: first pane surface 18a1 temperature 70.9° C., second pane surface 18a2 temperature 82.8° C., first element surface 22a temperature 114.7° C., second element surface 22b temperature 114.7° C., third pane surface 18b1 temperature 77.9° C., and fourth pane surface 18b2 temperature 66.2° C. As demonstrated by the temperatures, the conversion of the incident radiation 14 may cause unwanted heat to build in among the various elements of the window assembly 16. By identifying and/or predicting such conditions, the disclosure may provide for a reduction in the temperature of the surfaces 64.

Referring still to FIGS. 2 and 3, the variable transmittance window 12 may include an electro-optic element 22 comprising a first substrate 70 and a second substrate 72. The substrates 70 and 72 may correspond to thin glass substrates. In some embodiments, the substrates 70 and 72 may be of varying thicknesses and may be made of glass or other suitable substrate materials. Each substrate 70 and 72 may comprise a transparent electrically conductive layer 60 and 62, respectively, deposited thereon. The electrically conductive layers 60 and 62 may comprise indium-tin oxide (ITO).

The electrically conductive layers 60 and 62 may be at a thickness of at least two, full waves. In some embodiments, the transparent conductive layers 60 and 62 may be made of fluorine-doped tin oxide, doped zinc oxide, indium zinc oxide ($Zn_xIn_yO_z$), the materials described in U.S. Pat. No. 5,202,787, incorporated herein in its entirety by reference, such as TEC 20 or TEC 15, available from Libbey Owens-Ford Co. of Toledo, Ohio, or other transparent electrically conductive materials, such as, for example, dielectric/metal/dielectric stacks as described in U.S. Pat. No. 7,372,611 entitled "VEHICULAR REARVIEW MIRROR ELEMENTS AND ASSEMBLIES INCORPORATING THESE ELEMENTS", and U.S. Pat. No. 7,864,398, having William L. Tonar as the first named inventor entitled "IMPROVED COATINGS AND REARVIEW MIRROR ELEMENTS INCORPORATING THE COATINGS", the entire disclosures of which are incorporated herein by reference.

As shown, the space between first substrate 70 and second substrate 72 may be filled with an electrochromic medium 74 in electrical contact with layers 60 and 62. The electrochromic medium 74 may be deposited between the first substrate 70 and the second substrate 72 through a fill hole (not shown) in one of the first substrate 70 and second substrate 72. After the electrochromic medium 74 has been deposited between first substrate 70 and second substrate 72, a plug (not shown) made of a cationic epoxy material may be placed into the fill hole to seal the fill hole.

It should be appreciated that additional coatings can be selected to minimize the optical impact of these additional layers. For example, opaque, highly absorbing or highly refractive index coatings, which dramatically affect the optics of the final electro-optic element 22, may be avoided. Additionally, a stress compensation coating layer may have a low refractive index similar to that of the substrates 70 and 72. Layers with higher refractive indices may be used in certain applications.

Figure 6:
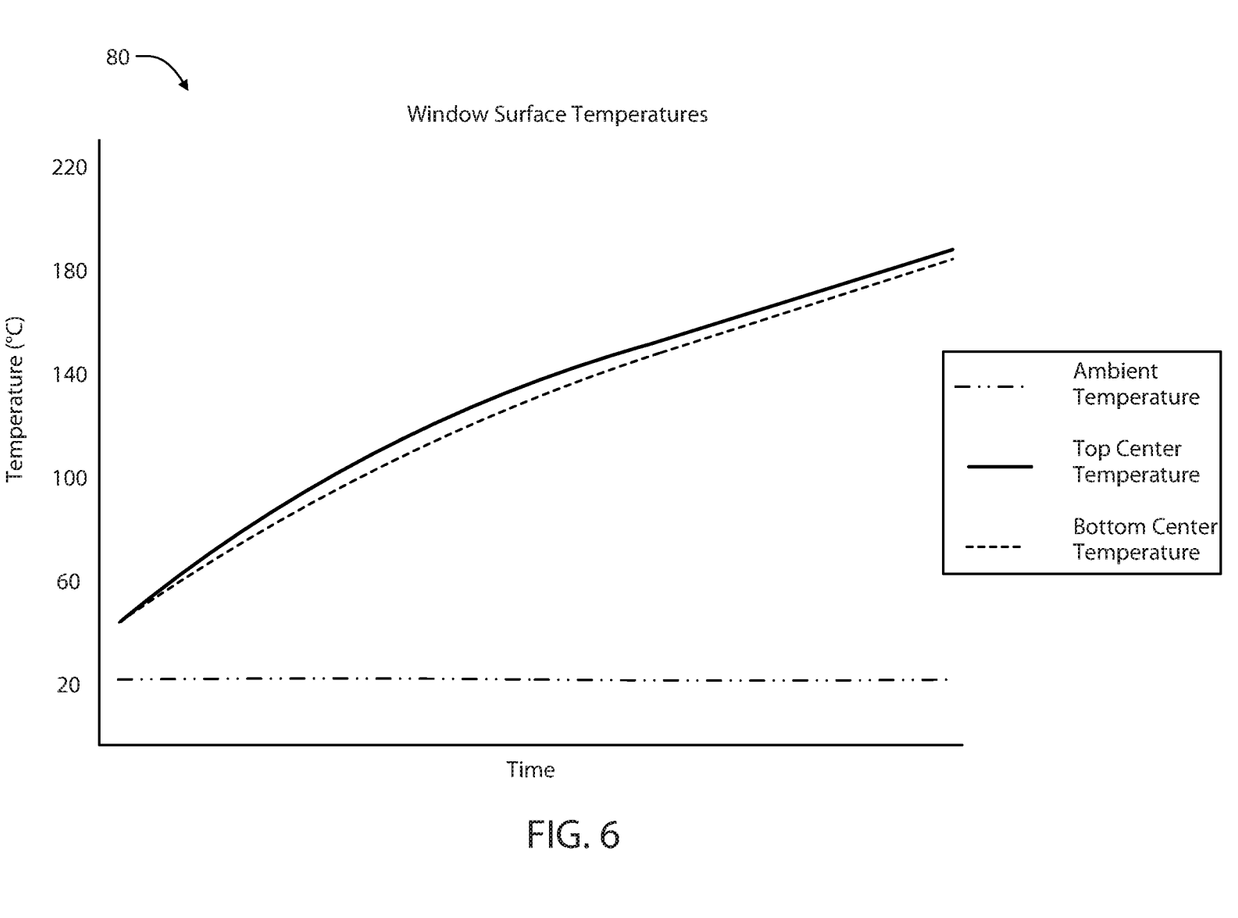
FIG. 6 is a diagram demonstrating a temperature measurement of a surface of the electro-optic assembly via a temperature sensor in accordance with the disclosure.

Referring now to FIG. 6, a diagram 80 of the temperatures of the surfaces 64 of the electro-optic element 22 is shown. The temperatures were measured during operation and may relate to a current draw of the electro-optic element 22. From the diagram 80 the results demonstrate a strong correlation of the temperature of the electro-optic element 22 ranging from approximately 45° C. to 190° C. at a center location similar to that shown in reference to the at least one sensor 46 in FIG. 3. The range of temperatures may correlate to a change in current draw of the electro-optic element 22 ranging from approximately 0.1 Amps to 1.2 Amps. Such a correlation may be programmed into the control routine of the processing circuitry 40 to identify an approximate temperature of the electro-optic element 22 based on the current signal received from the current monitor (C_MON) 44. In this way, the system 24 may control the electro-optic element 22 to maintain an increased transmittance based on a change in the current signal and corresponding temperature to control the temperature of the window assembly 16.

In some embodiments, the system 24 may further utilize a signal from the photo sensor 50 in combination with the current draw of the electro-optic element 22 to identify the approximate temperature of the electro-optic element 22. For example, the current draw of the electro-optic element 22 may correspond to a particular temperature of the electro-optic element 22 at a level of transmittance identified by the system 24 based on a transmittance signal from the photo sensor 50. In order to identify or approximate the temperature of the electro-optic element 22, the system 24 may utilize correlation data indicating an approximate temperature of the electro-optic element 22 based on the current draw at a particular transmittance level. In this way, the system 24 may utilize the correlation of the current draw to a level of transmittance to identify or approximate temperature of the electro-optic element 22 over a wide range of temperatures and transmittance levels.

Although the above description of the preferred embodiments are primarily directed to window control systems for aircraft, it should be appreciated that the preferred embodiments, including those utilizing master and local controller circuitry and algorithms, can be utilized to control the transmittance of windows in buildings and in other vehicles designed to carry passengers, such as, for example, ships, buses, and automobiles.

The above description is considered that of the preferred embodiments only. Modifications of the invention will occur to those skilled in the art and to those who make or use the invention. Therefore, it is understood that the embodiments shown in the drawings and described above are merely for illustrative purposes and are intended to be included within, but not intended to limit the scope of the invention, which is defined by the following claims as interpreted according to the principles of patent law, including the Doctrine of Equivalents.

What is claimed is:

1. A variable transmittance window system, comprising:
an electro-optic element disposed in a window assembly;
a driver circuit in communication with the electro-optic element;
a current sensor configured to identify a current draw of the driver circuit; and
a controller in communication with the driver circuit and the current sensor, wherein the controller is configured to:
identify a temperature of the electro-optic element based on the current draw;
compare the temperature to a temperature threshold; and
increase a transmittance of the electro-optic element in response to the temperature exceeding the temperature threshold.

2. The window system according to claim 1, wherein the controller is configured to increase the transmittance by limiting an output voltage supplied to the electro-optic element.

3. The window system according to claim 1, further comprising a photo sensor disposed proximate to the electro-optic element.

4. The window system according to claim 3, wherein the controller is further configured to:
identify a transmittance level of the electro-optic element based on a transmittance signal received from the photo sensor.

5. The window system according to claim 4, wherein the controller is further configured to:
identify the temperature based on the current draw of the electro-optic element and the transmittance signal.

6. The window system according to claim 4, wherein the controller is further configured to:
identify a condition of the temperature based on a correlation of the current draw to a transmittance level of the electro-optic element identified from the transmittance signal.

7. An electrical control system for controlling a variable transmittance window, comprising:
a driver circuit in communication with an electro-optic element; and
a controller in communication with the driver circuit, wherein the controller is configured to:
identify a temperature condition of the electro-optic element;
adjust an output voltage supplied to the electro-optic element in response to the temperature condition; and
adjust the output voltage increasing a transmittance of the electro-optic element in response to the temperature condition indicating that a temperature threshold is exceeded.

8. The control system according to claim 7, wherein the controller comprises a current sensor configured to identify a current draw of the electro-optic element.

9. The control system according to claim 8, wherein the controller is further configured to:
identify the temperature condition in response to the current draw by the electro-optic element.

10. The control system according to claim 8, further comprising a photo sensor disposed proximate to the electro-optic element.

11. The control system according to claim 10, wherein the controller is further configured to:
identify a transmittance level of the electro-optic element based on a transmittance signal received from the photo sensor.

12. The control system according to claim 11, wherein the controller is further configured to:
identify the temperature condition based on the current draw of the electro-optic element and the transmittance signal.

13. The control system according to claim 11, wherein the controller is further configured to:
identify the temperature condition based on a correlation of the current draw to a transmittance level of the electro-optic element identified from the transmittance signal.

14. The control system according to claim 7, further comprising a temperature sensor disposed proximate the electro-optic element.

15. The control system according to claim 14, wherein the controller is further operable to:
identify the temperature condition of the electro-optic element based on a temperature signal from the temperature sensor.

16. A variable transmittance window system, comprising:
an electro-optic element disposed in a window assembly;
a driver circuit in communication with the electro-optic element;
at least one sensor configured to identify a property of the electro-optic element; and
a controller in communication with the driver circuit and the at least one sensor, wherein the controller is configured to:
identify a temperature of the electro-optic element based on the property of the electro-optic element;
compare the temperature to a temperature threshold; and
increase a transmittance of the electro-optic element in response to the temperature exceeding the temperature threshold.

17. The window system according to claim 16, wherein the sensor comprises at least one of a current sensor, a temperature sensor, and a photo sensor.

18. The window system according to claim 16, wherein the sensor comprises a current sensor configured to identify a current draw of the driver circuit.

19. The window system according to claim 18, wherein the controller is further configured to:
identify the temperature of the electro-optic element based on a correlation of the current draw to a temperature of the electro-optic element.

* * * * *